US006407940B1

(12) United States Patent
Aizawa

(10) Patent No.: US 6,407,940 B1
(45) Date of Patent: Jun. 18, 2002

(54) MEMORY CARD DEVICE INCLUDING A CLOCK GENERATOR

(75) Inventor: Hideo Aizawa, Hamura (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/954,184

(22) Filed: Sep. 18, 2001

(30) Foreign Application Priority Data

Sep. 29, 2000 (JP) ........................................ 2000-300446

(51) Int. Cl.[7] .............................. G11C 5/02; G11C 8/00; G11C 16/04
(52) U.S. Cl. ...................... 365/52; 365/233; 365/185.33
(58) Field of Search ............................ 365/52, 63, 233, 365/185.33

(56) References Cited

U.S. PATENT DOCUMENTS

| 5,473,573 A | * | 12/1995 | Rao ............................. 365/52 |
| 5,513,135 A | * | 4/1996 | Dell et al. ..................... 365/52 |
| 5,867,448 A | * | 2/1999 | Mann ........................... 365/52 |
| 5,923,611 A | * | 7/1999 | Ryan ........................... 365/233 |
| 6,034,878 A | * | 3/2000 | Osaka et al. .................. 365/52 |
| 6,049,476 A | * | 4/2000 | Laudon et al. ................ 365/52 |
| 6,215,727 B1 | * | 4/2001 | Parson et al. ............... 365/233 |

FOREIGN PATENT DOCUMENTS

JP          2000-66654          3/2000

* cited by examiner

Primary Examiner—Trong Phan
(74) Attorney, Agent, or Firm—Finnegan, Henderson, Farabow, Garrett, & Dunner, L.L.P.

(57) ABSTRACT

Disclosed herein is a card having a controller and a clock control circuit. The controller incorporates a core logic, and the clock control circuit incorporates a PLL. When a card becomes idle to wait for commands, the clock control circuit stops the supply of a clock signal to the core logic. The clock control circuit can operate in two clock control modes. In the first clock control mode, the circuit stops the PLL. In the second clock control mode, the circuit shuts off the clock signal to be supplied from the PLL to the controller.

11 Claims, 6 Drawing Sheets

MEMORY CARD DEVICE INCLUDING A CLOCK GENERATOR

CROSS-REFERENCE TO RELATED APPLICATIONS

This application is based on Japanese Patent Application No. 2000-300466, filed Sep. 29, 2000, the contents of which is incorporated herein by reference.

BACKGROUND OF THE INVENTION

1. Field of the Invention

The present invention relates to a memory card device that can be used in various types of electronic apparatuses. More particularly, the invention relates to a memory card device that includes a clock generator.

2. Description of the Related Art

In recent years, various portable electronic apparatuses have been developed. Among them are personal computers, PDAs, digital cameras, mobile telephones. Memory cards, which are removable memory devices, are used in these portable electronic apparatuses. Two types of memory cards are known. The first is a PCMCIA card (generally known as "PC card"). The second is a SD (Secure Digital) card that is smaller than the PCMCIA card.

The SD card incorporates a flash memory. It is small and can yet store as much data as desired and operate at as high a speed as desired. The SD card has an improved 9-pin interface. Of the nine pins, four serve to transfer data to the host apparatus. Despite a few interface pins it has, the SD card can transfer data in sufficient performance.

Recently it is demanded that power consumption be reduced in small memory cards typified by SD cards. To reduce power consumption in an electronic device, the supply of clock signals to the internal core logic units of the electronic device may be stopped as is known in the art. In a device including a PLL (Phase Locked Loop), more power consumption can be reduced by stopping the PLL operation itself than by stopping the supply of clock signals from the PLL to the internal core logic units.

Once the PLL operation is stopped to set the device into power-saving mode, however, it will take much time to set the device return into the normal operating mode. This is because the PLL cannot generate stable clock signals for some time after it starts operating again. In other words, the internal core logic units cannot operate until the clock signals become sufficiently stable.

Particularly, a memory card that incorporates a nonvolatile memory such as a flash EEPROM cannot respond fast, because it takes a relatively long time to access the nonvolatile memory. To make the matter worse, the internal core logic units will need a long time to restart their operations once the PLL provided in the device is stopped to save power. The memory card inevitably responds even more slowly.

BRIEF SUMMARY OF THE INVENTION

An object of the present invention is to provide a memory card device that can operate fast and can yet save power sufficiently.

To achieve the object, a memory card device is designed to be removably inserted in a host apparatus, the memory card device comprises: a nonvolatile memory device; a controller configured to execute commands supplied from the host apparatus, thereby to write data into, and read data from, the nonvolatile memory; a clock signal generator that includes a PLL configured to generate a clock signal to be supplied to the controller; and a clock control unit configured to operate in a first clock control mode, wherein the clock control unit stops the operation of the PLL, if the controller becomes idle while the memory card device is in a first state in which the memory card device receives a command concerning an access to the nonvolatile memory device from the host apparatus, and configured to operate in a second clock control mode, wherein the clock control unit shuts off the clock signal outputted from the PLL, if the controller becomes idle while the memory card device is in a second state in which the memory card device needs not to receive the command concerning an access to the nonvolatile memory device from the host apparatus.

In the memory card device, the clock control unit stops supplying the clock signal to the controller when the controller becomes idle to wait for commands. The supply of the clock signal can be stopped in two modes, i.e., the first clock control mode for stopping the operation of the PLL, and the second clock control mode for shutting off the clock signal outputted from the PLL. The clock control mode is switched, from the first to the second, or vice versa, in accordance with whether the current state of the card is a state in which the card device receives a command concerning an access to the nonvolatile memory device from the host apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiment of the invention, and together with the general description given above and the detailed description of the embodiment given below, serve to explain the principles of the invention.

DETAILED DESCRIPTION OF THE INVENTION

An embodiment of the present invention will be described, with reference to the accompanying drawings.

Figure 1:
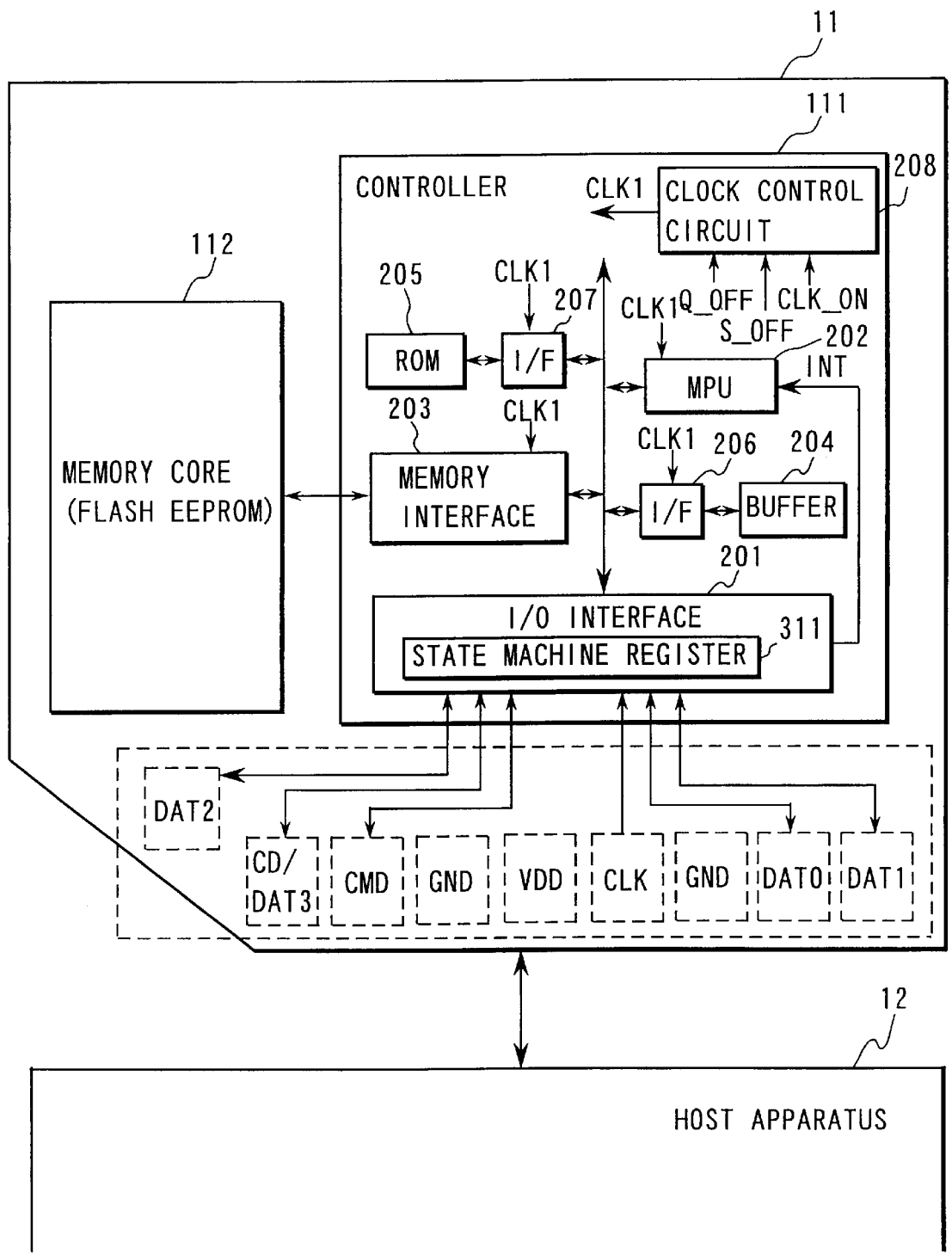
FIG. 1 is a block diagram showing a memory card device according to the embodiment of the present invention.

FIG. 1 shows a memory card device 11 and an electronic apparatus (host apparatus) 12. The memory card device 11 is an embodiment of the invention and used in the electronic apparatus 12. More specifically, the device 11 is an SD (Secure Digital) memory card. Nonetheless, it may be any other type of a memory card device.

The SD memory card 11 can be inserted into, and removed from, a card slot made in the host apparatus 12. Note that the host apparatus 12 may be a personal computer, a PDA, a digital camera, a mobile telephone, or the like. The host apparatus 12 generates commands, which control the data communication between the SD memory card 11 and the host apparatus 12.

As FIG. 1 shows, the SD memory card 11 incorporates a controller 111 and a memory core 112. The memory core 112 is a non-volatile memory such as a flash EEPROM. The controller 111 performs various command processes, in response to commands supplied from the host apparatus 12. For example, it writes data into the memory core 112, reads data from the memory core 12 and performs other operations directed by commands.

The controller 111 comprises an input/output interface 201, MPU 202, memory interface 203, buffer memory 204, ROM 205, control logic units 206 and 207, and clock control circuit 208. The unit 206 is provided to control the buffer memory 204, and the unit 207 to control the ROM 205.

The input/output interface 201 receives commands and data from the host apparatus 12 and transmits data to the host apparatus 12. The data communication with the host apparatus 12 is performed through a clock line CLK, a command pin CMD and four data pins DAT3 to DAT0. The transfer of commands from the host apparatus 12 to the SD memory card 11 and the transfer of data between the host apparatus 12 and the SD memory card 11 are effected in synchronization with the clock signal CLK supplied from the host apparatus 12 to the SD memory card 11.

The host apparatus 12 need not always supply the clock signal CLK to the SD memory card 11. It may not supply the clock signal to the SD memory card 11 while data communication is not need between it and the SD memory card 11.

The input/output interface 201 operates in synchronization with the clock signal CLK supplied from the host apparatus 12. The interface 201 incorporates a state machine register 311, which holds the data representing the state the SD memory card 11 takes at present. (More correctly, the data represents the current state of the controller 111.) The SD memory card 11 may take various states. The state of the card 11 transits from one state to another states as its operation proceeds.

The state and operating modes of the SD memory card 11 will be described. The card 11 can operate in the following two modes.

(1) Card Identification Mode

While the SD memory card 11 is operating in this mode, the host apparatus 12 can identify the attributes of the card 11.

(2) Data Transfer Mode

While the SD memory card 11 is operating in this mode, data can be transferred between the memory card 11 and the host apparatus 12. The following states are defined for the data transfer mode:

Stand-by State
Transfer State
Sending-data state
Receive-data state
Programming State
Disconnect State The stand-by state is the first state the SD memory card 11 takes when the operating mode is switched from the card identification mode to the data transfer mode. As long as the memory card 11 remains in the stand-by state, the host apparatus 12 can transmit no memory-access commands.

Once the SD memory card 11 takes the transfer state, it can receive memory-access commands from the host apparatus 12. In other words, the card 11 waits for memory-access commands. When the card 11 receives a memory-access command while staying in the transfer state, it transits to the sending-data state or the receive-data state, depending on the type of the memory-access command.

A specific command supplied from the host apparatus 12 can achieve the transition of state, from the stand-by state to the transfer state or vice versa. To make a memory access, the host apparatus 12 must transit the SD memory card 11 from the stand-by state to the transfer state in order to accomplish a memory access. The card 11 can receive the command for indicating transition to the transfer state, while staying in the stand-by state.

When the SD memory card 11 receives a data-read command in the transfer state, it transits to the sending-data state. While the card 11 remains in the sending-data state, data is read from the memory core 112 and transmitted from the card 11 to the host apparatus 12. Upon transmitting all data to the host apparatus 12, the card 11 returns to the transfer state.

When the SD memory card 11 receives a data-write command in the transfer state, it transits to the receive-data state. While the card 11 is staying in the receive-data state, the data transferred from the host apparatus 12 is accumulated in the buffer memory 204. When the data is completely accumulated in the buffer memory 204, the state of the SD memory card 11 changes, from the receive-data state to the programming state.

In the programming state, the data stored in the buffer memory 204 is written into the memory core 112. When all the data is written into the memory core 112, the SD memory card 11 transits return to the transfer state.

The SD memory card 11 may wait for commands supplied from the host apparatus 12 in the stand-by state and the transfer state. In the present embodiment, the transfer state and the stand-by state will be referred to as "Q_state" and "S_state," respectively. The card 11 must respond fast to the host apparatus 12 in the Q_state (transfer state), and need not respond fast thereto in the S_state (stand-by state). The Q_state and the S_state will be explained with reference to FIG. 3.

Figure 3:
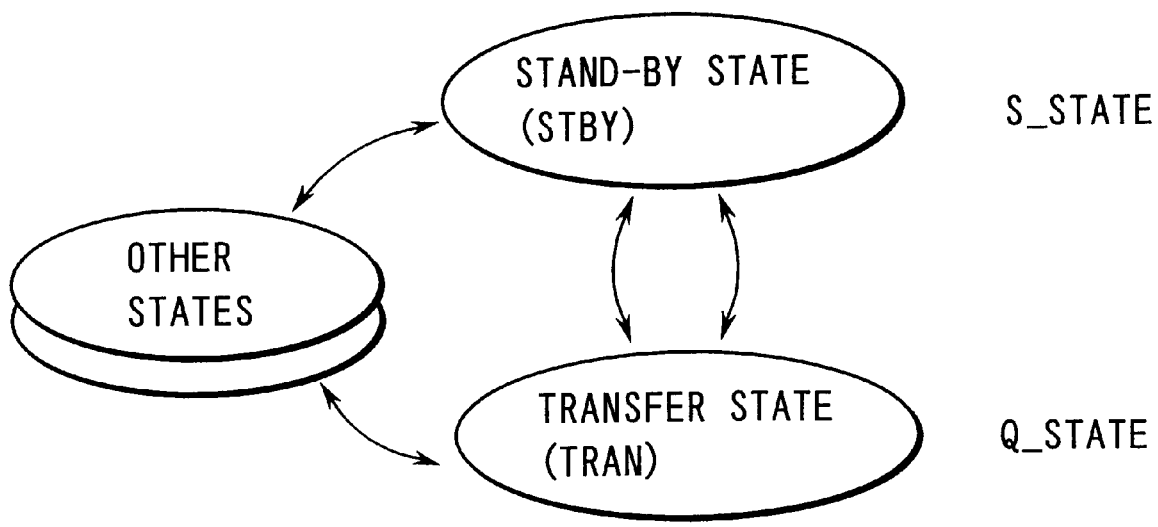
FIG. 3 is a diagram illustrating the relation between the clock control mode and the status of the memory card device of FIG. 1.

When the SD memory card 11 (more correctly, the controller 111) becomes idle to wait for commands, it may be stayed in the stand-by state (or STBY in FIG. 3), or the transfer state (or TRN in FIG. 3). In the present embodiment, if the SD memory card 11 becomes idle while it is the stand-by state (STBY), a first clock control operation is performed in order to achieve lower power consumption, if the SD memory card 11 becomes idle while it is the transfer state (TRN), a second clock stop control operation is performed in order to achieve faster clock restart, but at high power consumption.

Referring back to FIG. 1, the components of the controller 111 will be described.

The MPU 202 is a processor that controls the other components of the SD memory card 11. The MPU 202 executes various commands in accordance with the program stored in the ROM 202. The memory interface 203 controls accesses to the memory core 112. In other words, the interface 203 writes data into, read data from, and erase data in, the memory core 112 under the control of the MPU 202. The buffer memory 204 is used mainly as a posted buffer for storing the write data supplied from the host apparatus 12, which is to be written into the memory core 112.

To program most nonvolatile memories, a representative of which is a flash EEPROM, data must be erased in units of blocks, and new data must be written in units of blocks. Inevitably it takes a long time to rewrite data in nonvolatile memories. The SD memory card 11 of this embodiment supplies a signal to the host apparatus 12 when the buffer memory 204 finishes storing the data supplied from the host apparatus 12, thus informing the apparatus 12 that the data-write command has been executed. Then, the controller 111 erases data in, and writes data into, the memory core 112 (i.e., flash EEPROM).

The host apparatus 12 may stop supplying the clock signal CLK to the SD memory card 11, upon receiving the signal informing the completion of command execution. Nonetheless, the card 111 keeps operating, because the clock control circuit 208 generates an internal clock signal CLK1.

As indicated earlier, the input/output interface 201 operates in synchronization with the clock signal CLK supplied from the host apparatus 12. On the other hand, the core logic units provided in the controller 111 (i.e., the MPU 202, memory interface 203 and control logic units 206 and 207) operates in synchronization with the internal clock signal CLK1 generated by the clock control circuit 208.

The clock control circuit 208 is a clock-generating circuit having a PLL (phase locked loop). The PLL multiplies the frequency of the source clock signal generated by the internal oscillator. The multiplied source clock signal is the internal clock signal CLK1. The clock control circuit 208 is controlled by the clock control signals Q_OFF, S_OFF, CLK_ON, all generated in the controller 111.

The clock control signal Q_OFF causes the clock control circuit 208 to stop outputting the internal clock signal CLK1. The clock control signal Q_OFF is used in Q_state. When the clock control circuit 208 receives the signal Q_OFF, it stops outputting the internal clock signal CLK1, though the PLL keeps operating. The clock control signal S_OFF causes the clock control circuit 208 to stop PLL operation. The clock control signal S_OFF is used in S_state. When the clock control circuit 208 receives the signal S_OFF, it stops PLL operation; thereby the internal clock signal CLK1 is stopped. The clock control signal CLK_ON causes the clock control circuit 208 to start supplying the internal clock signal CLK1 again.

The scheme of clock control will be described, with reference to FIG. 2.

Figure 2:
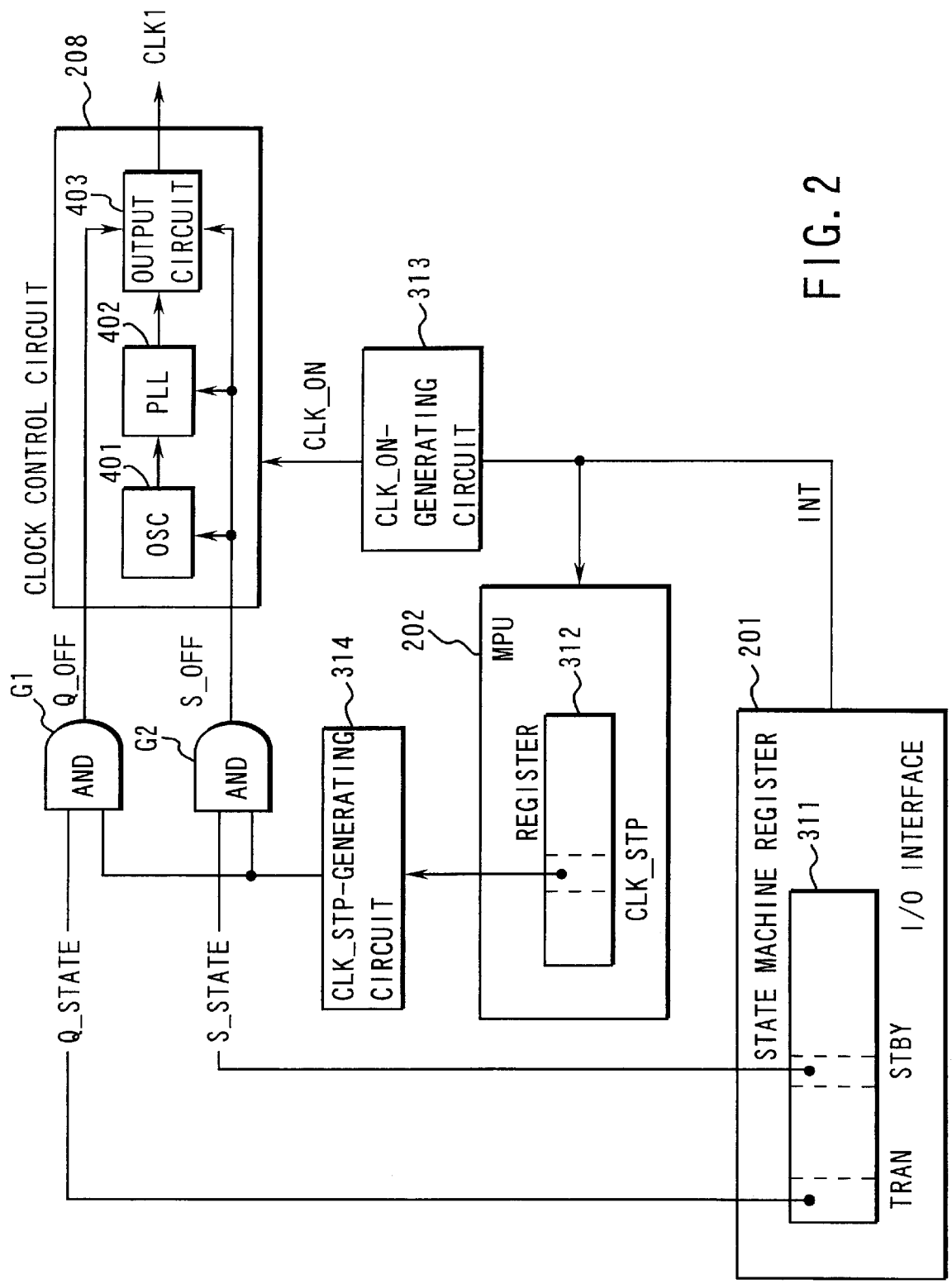
FIG. 2 is a diagram explaining the clock control operation performed in the memory card device shown in FIG. 1.

As FIG. 2 shows, the clock control circuit 208 comprises an oscillator (OSC) 401, a PLL 402 and an output circuit 403. The PLL 402 comprises a phase comparator, a low-pass filter, a VCO (Voltage-Controlled Oscillator) and a frequency demultiplier. When the clock control circuit 208 receives the clock control signal Q_OFF, the output circuit 403 is turned off, whereby the clock control circuit 208 stops outputting the clock signal CLK1. In this case, neither the oscillator 401 nor the PLL 402 is stopped. When the clock control circuit 208 receives the clock control signal S_OFF, the oscillator 401, the PLL 402 and the output circuit 403 are stopped.

The signal Q_OFF is input to the clock control circuit 208 through a two-input AND gate G1. The AND gate G1 receives at its first input terminal the transfer bit (TRAN) of the state machine register 311. The transfer bit (TRAN), which is used as Q-state signal, remains at value "1" while the SD memory card 11 stays in the transfer state. The AND gate G1 receives at its second input terminal an output signal of a clock-stop instruction generating circuit 314. The instruction generating circuit 314 generates a pulse signal that remains at "1" while the clock-stop instruction bit CLK_STP having logic value "1" is set at a prescribed position in the register 312 that is provided in the MPU 202.

Figure 4:
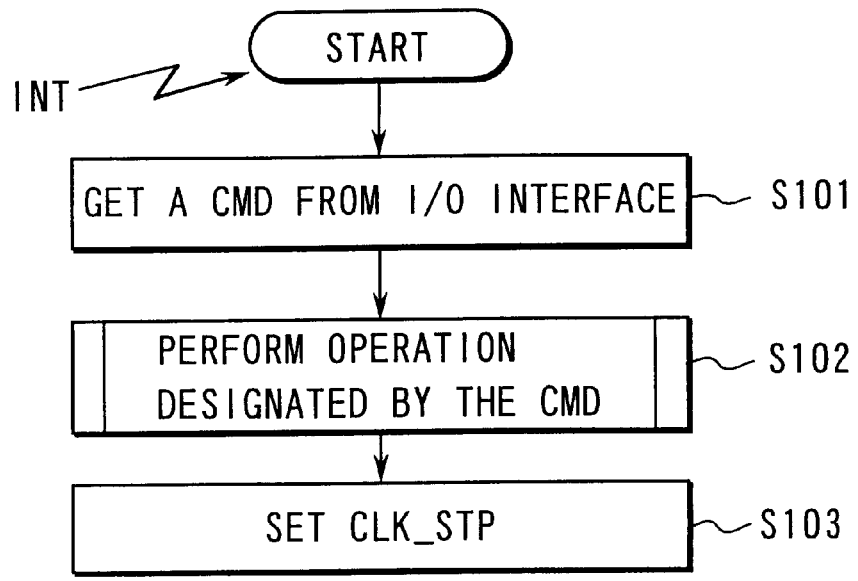
FIG. 4 is a flowchart explaining how the clock control circuit stops generating the clock signal in the memory card device of FIG. 1.

The MPU 202 sets the clock-stop instruction bit CLK_STP at logic value "1" when the MPU 202 becomes idle to wait for commands. The MPU 202 assumes the idling state upon executing all commands (including internal operations). That is, as shown in FIG. 4, the MPU 202 gets a command CMD from the input/output interface 201 when it receives an interruption signal INT from the host apparatus 12 (Step S101). This is because interruption signal INT shows that the host apparatus 12 has supplied the command CMD to the SD memory card 11. Then, the MPU 202 performs the operation designated by the command CMD it has acquired (Step S102). Upon finishing the operation, the MPU 202 set the clock-stop instruction bit CLK_STP having logic value "1" in the register 312 unless it has received any new command (Step S103).

The signal S_OFF is input to the clock control circuit 208 through a two-input AND gate G2. The AND gate G2 receives at its first input terminal the stand-by state bit (STBY) of the state machine register 311. The stand-by state bit (STBY) is set at "1" while the SD memory card 11 remains in the stand-by state. The AND gate G2 receives at its second input terminal an output signal CLK_STP of the clock-stop instruction generating circuit 314.

The signal CLK_ON is generated by a CLK_ON-generating circuit 313. The circuit 313 generates the signal CLK_ON when it is triggered by the interruption signal INT the input/output interface 201 has generated upon receipt of a command from the host apparatus 12. The signal CLK_ON cause the clock control circuit 208 to start generating the clock signal CLK1.

Figure 5:
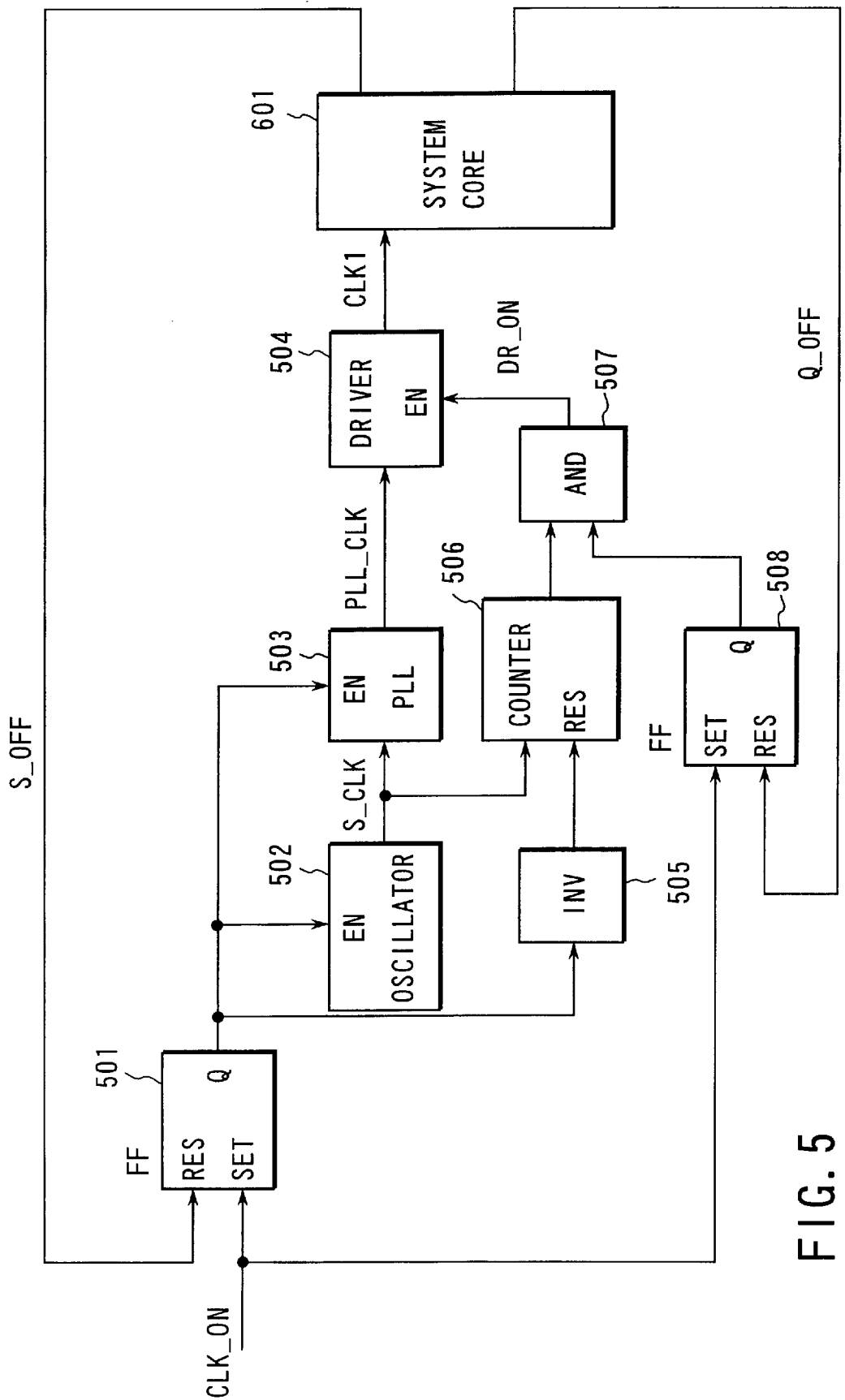
FIG. 5 is a block diagram of the clock control circuit provided in the memory card device of FIG. 1.

FIG. 5 shows the clock control circuit 208 in detail.

As shown in FIG. 5, the clock control circuit 208 comprises an RS flip-flop 501, an oscillator 502, a PLL 503, a driver 504, an inverter (INV) 505, a counter 506, an AND gate 507, and an RS flip-flop 508. The oscillator 502, PLL 503 and driver 504 correspond to the oscillator 401, PLL 402 and output circuit 403, respectively, which are shown in FIG. 2. The system core 601 shown in FIG. 5 represents all circuits that are driven by the clock signal CLK1.

How the clock control circuit 208 shown in FIG. 5 performs its function will be explained, with reference to the timing charts of FIGS. 6 and 7.

Figure 6:
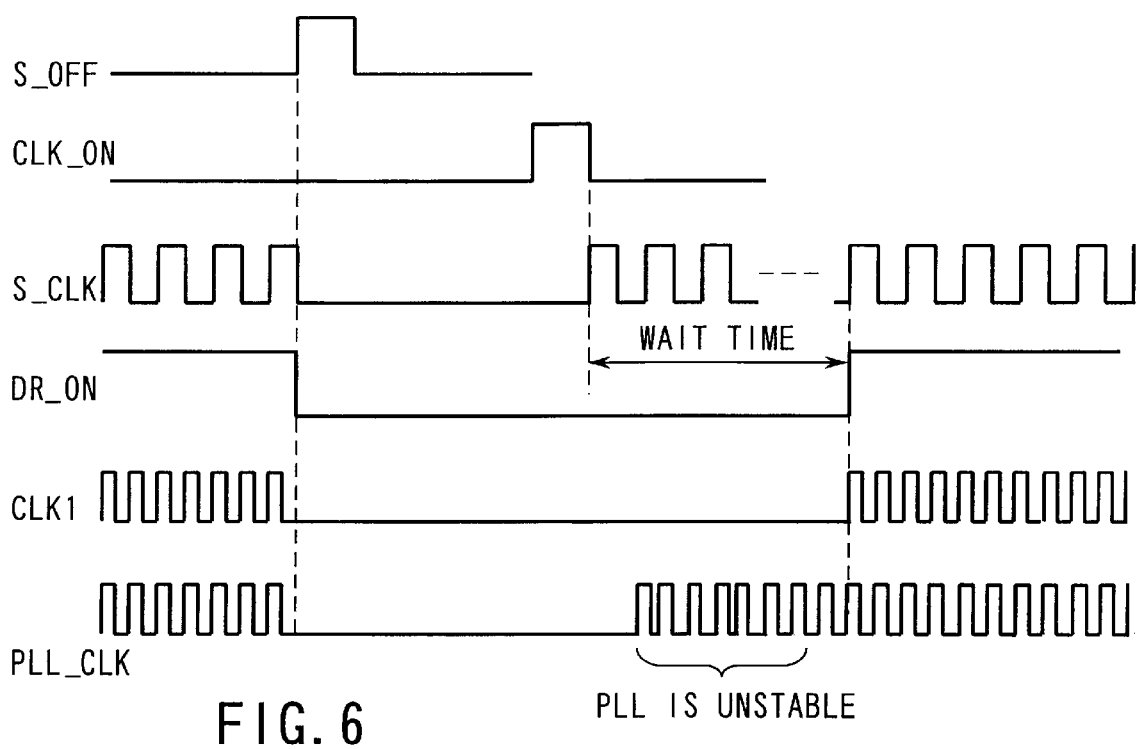
FIG. 6 is a timing chart explaining how the clock control circuit operates while the memory card device remains in S_state.

FIG. 6 illustrates how the clock control is effected while the SD memory card 11 remains in the S_state. The Q output of the RS flip-flop 501 stay at "1" until the signal S_OFF is input to the clock control circuit 208. The Q output of the RS flip-flop 508 stay at "1" until the signal S_OFF is input to the clock control circuit 208. Hence, the oscillator 502 and the PLL 503 are on. The oscillator 502 outputs a source clock signal S_CLK, which is supplied to the PLL 503. The PLL 502 multiplies the clock signal S_CLK, thereby generating a clock signal PLL_CLK. The counter 506 counts the pulses of the clock signal S_CLK for a predetermined time the PLL 504 requires until it starts a stable operation. The counter 506 outputs a signal "1" upon counting a prescribed number of the pulses after it has been reset. Hence, the driver-on signal DR_ON output from the AND gate 507 remains at "1" until the signal S_OFF is input to the clock control circuit 208. Thus, before the signal S_OFF is input, the driver 504 supplies the clock signal PLL_CLK, or the clock signal CLK1, to the system core 601.

When the MPU 202 become idle to wait for commands in the S_state (STBY), the signal S_OFF is generated in the controller 111. Therefore, the Q output of the RS flip-flop 501 becomes "0," stopping both the oscillator 502 and the PLL 503. The clock control circuit 208 no longer outputs a clock signal PLL_CLK, or the clock signal CLK1. The inverter 505 inverts the Q output, resetting the counter 506. The counter 506 outputs a signal "0". The driver 504 is therefore stopped.

The host apparatus 12 may generates a command in this condition. If so, a signal CLK_ON is generated and supplied to the clock control circuit 208. In the circuit 208, the Q output of the RS flip-flop 501 is set at "1." Then, the oscillator 502 and the PLL 503 start operating, whereby the circuit 208 begins to output the clock signal PLL_CLK. Upon lapse of a predetermined time from the start of the oscillator 502 and PLL 503, the counter 506 outputs "1," setting the driver-on signal DR_ON at "1." Thus, the clock signal CLK1 would not be output before the operation of the PLL 503 comes stable.

Figure 7:
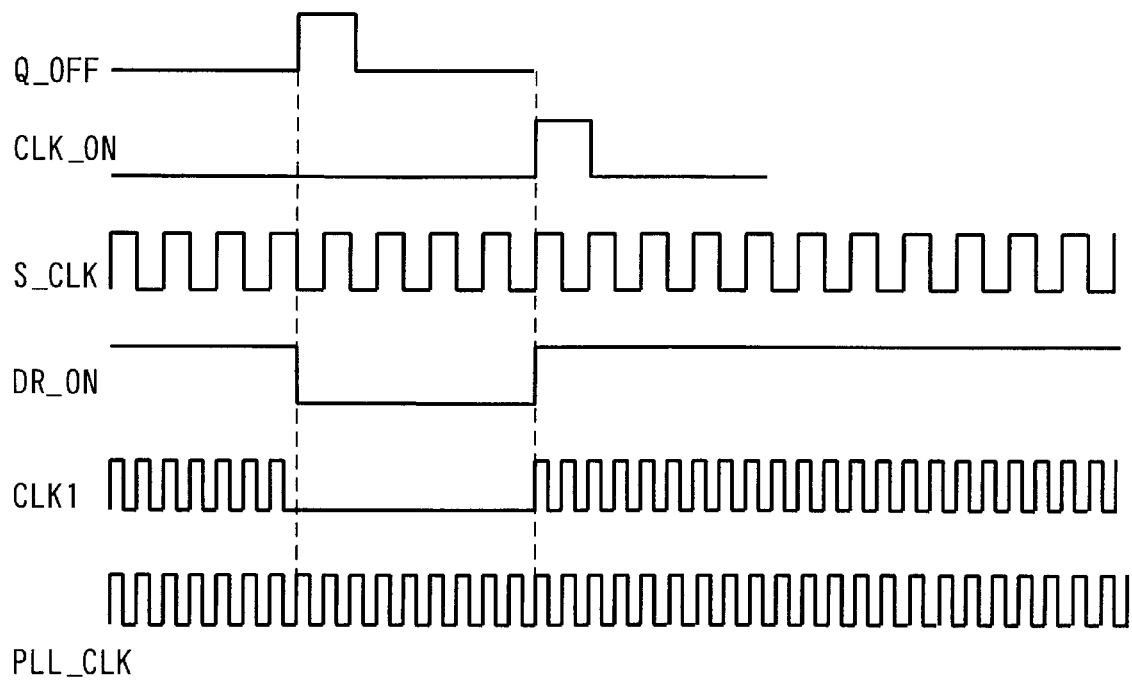
FIG. 7 is a timing chart explaining how the clock control circuit operates while the memory card device stays in Q_state.

FIG. 7 illustrates how the clock control is effected while the SD memory card 11 remains in the Q state. The Q output of the RS flip-flop 501 and the Q output of the RS flip-flop 508 remain at "1" until the Q_OFF is input to the clock control circuit 208. The oscillator 502 and the PLL 503 therefore remain on. The oscillator 502 outputs a clock signal S_CLK, and the PLL 503 outputs a clock signal PLL_CLK obtained by multiplying the clock signal S_CLK. The driver-on signal DR_ON is held at "1," too. The driver 504 therefore supplies the signal PLL_CLK, as clock signal CLK1, to the system core 601.

When the MPU 202 become idle to wait for commands in the Q_state (TRAN), the signal Q_OFF is generated in the controller 111. Therefore, the Q output of the RS flip-flop 508 becomes "0," and the driver-on signal DR_ON supplied from the AND gate 504 becomes "0." Hence, the driver 504 shuts off the signal PLL_CLK. The clock control circuit 208 no longer outputs the clock signal CLK1. Both the oscillator 502 and the PLL 503 keep operating.

The host apparatus 12 may generates a command in this condition. If so, a signal CLK_ON is generated and supplied to the clock control circuit 208. In the circuit 208, the Q output of the RS flip-flop 508 is set at "1." The driver-on signal DR_ON is thereby set at "1." Thus, the clock control circuit 208 immediately outputs the clock signal CLK1 again.

In the present embodiment, two clock control schemes are interchangeably used, depending on the internal state of the SD memory card 11. In the first control scheme, the PLL 503 is stopped. In the second control scheme, the PLL 503 keeps operating and the clock signal CLK1 is not supplied to the core logic units.

Figure 8:
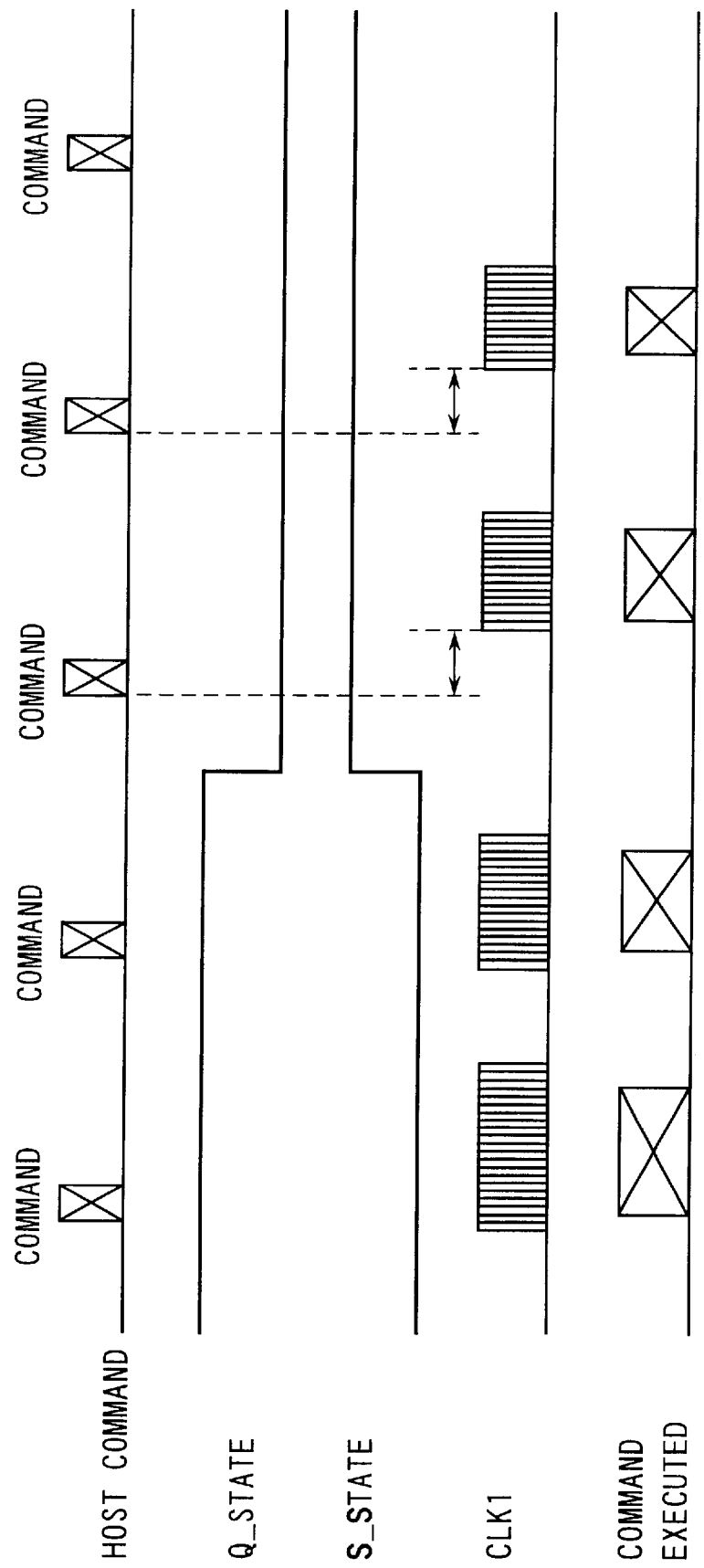
FIG. 8 is a timing chart showing how the controller incorporated in the memory card device is repeatedly started and stopped.

FIG. 8 illustrates how the controller 111 is repeatedly started and stopped.

In the Q state, the supply of the clock signal CLK1 is stopped every time the controller 111 finishes executing a command, as is illustrated in FIG. 8. When the controller 111 receives another command, the supply of the clock signal CLK1 is immediately started again and the controller 111 immediately starts executing the received command.

In the S state, the PLL 503 is stopped every time the controller 111 finishes executing a command. The PLL 503 starts operating when the controller 111 receives another command. When the operation of the PLL 503 comes stable thereafter, the supply of the clock signal CLK1 is started again and the controller 111 starts executing the received command.

Of the commands supplied from the host apparatus 12, some commands are need not to be executed by the MPU 302. Upon receipt of these commands, the input/output interface 201 only needs to make a response to the host apparatus 12. When the input/output interface 201 receives such a command, the interface 201 generates no interruption signals INT. In this case, the control circuit 208 remains to stop the clock signal CLK1.

The clock control circuit according to the present embodiment effectively works in any type of a card device, such as an I/O card, which incorporates a clock-signal generating circuit.

As described above, the transfer state is Q_state in which the card device must respond fast to the host apparatus, and the stand-by state is S_state in which the card device need not respond fast to the apparatus. The present invention is not limited to an SD memory card. Rather, it may be applied to a card device of any other type. If so, the card device of any other type must respond fast to the host apparatus, while remaining in the Q_state, and need not respond fast to the host apparatus, while staying in the S_state. In this case, too, power can be saved, without decreasing the operating efficiency of the circuits incorporated in the card device.

The circuits incorporated in the card device may operate as efficiently as desired even if an event takes place to release the card device from the idling state. If this is the case, it suffices to operate the clock control circuit in accordance with the clock-stop instruction signal S_OFF. Conversely, the circuits in the card device may fail to operate as efficiently as desired, when an event takes place to release the card device from the idling state. In this case, it suffices to operate the clock control circuit in accordance with the clock-stop instruction signal Q_OFF.

As has been described above, two clock control schemes are automatically switched from one to the other, in accordance with the state in which the card device has become idle. The power consumption in the card device can be much reduced, without decreasing the operating efficiency of the circuits incorporated in the card device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory card device capable of being removably inserted in a host apparatus, said memory card device comprising:
   a nonvolatile memory device;
   a controller configured to execute commands supplied from the host apparatus, thereby to write data into, and read data from, the nonvolatile memory device;
   a clock signal generator including a PLL configured to generate a clock signal to be supplied to the controller; and
   a clock control unit configured to operate in a first clock control mode, wherein the clock control unit stops the operation of the PLL, if the controller becomes idle while the memory card device is in a state in which the memory card device receives a command concerning an access to the nonvolatile memory device from the host apparatus, and configured to operate in a second clock control mode, wherein the clock control unit shuts off the clock signal outputted from the PLL, if the controller becomes idle while the memory card device is in a state in which the memory card device needs not to receive the command concerning an access to the nonvolatile memory device.

2. The memory card device according to claim 1, further comprising a clock supply control unit configured to start the operation of the PLL, when a command is supplied from the host apparatus to the memory card device while the operation of the PLL is stopped, and to supply the clock signal to the controller, upon lapse of a predetermined time from starting of the operation of the PLL, said predetermined time being required time by the PLL to operate stably.

3. The memory card device according to claim 1, wherein the clock signal generator includes an oscillator configured to generate a source clock signal which is inputted to the PLL, and the clock control unit stops both the PLL and the oscillator in the first clock control mode.

4. A memory card device capable of being removably inserted in a host apparatus, said memory card device comprising:
a nonvolatile memory device;
a controller configured to be set in a transfer state to receive a command concerning an access to the nonvolatile memory device and to be set in a stand-by state to receive a command for transition to the transfer state, and configure to access to the nonvolatile memory device in accordance with a command concerning an access to the nonvolatile memory device;
a clock signal generator including a PLL configured to generate a clock signal to be supplied to the controller; and
a clock control unit configured to operate in a first clock control mode to stop the operation of the PLL if the controller starts waiting for commands in the stand-by state, and configured to operate in a second clock control mode to shut off the clock signal outputted from the PLL if the controller starts waiting for commands in the transfer State.

5. The memory card device according to claim 4, further comprising a clock supply control unit configured to start the operation of the PLL, when a command is supplies from the host apparatus to the memory card device while the operation of the PLL is stopped, and configured to supply the clock signal to the controller, upon lapse of a predetermined time from starting of the operation of the PLL, said predetermined time being time required by the PLL to operate stably.

6. The memory card device according to claim 4, wherein the clock signal generator includes an oscillator configured to generate a source clock signal which is inputted to the PLL, and the clock control unit stops both the PLL and the oscillator in the first clock control mode.

7. A memory card device capable of being removably inserted in a host apparatus, said memory card device comprising:
a nonvolatile memory device;
a controller configured to execute commands supplied from the host apparatus, thereby to write data into, and read data from, the nonvolatile memory;
a clock signal generator including a PLL configured to generate a clock signal to be supplied to the controller;
a first clock stop unit configure to stop the operation of the PLL, in order to stop supplying the clock signal to the controller;
a second clock stop unit configure to shut off the clock signal outputted from the PLL, in order to stop supplying the clock signal to the controller; and
a control unit configure to activate the first clock stop unit or the second clock stop unit when the controller becomes idle to wait for commands, in accordance with a current state of the memory card device.

8. The memory card device according to claim 7, further comprising a clock supply control unit configured to start the operation of the PLL, when a command is supplies from the host apparatus to the memory card device while the operation of the PLL is stopped, and to supply the clock signal to the controller, upon lapse of a predetermined time from starting of the operation of the PLL, said predetermined time being time required by the PLL to operate stably.

9. The memory card device according to claim 7, wherein the control unit activates the second clock stop unit if the controller becomes idle while the memory card device is in a state in which the memory card device receives a command concerning an access to the nonvolatile memory device from the host apparatus, and activates the first clock stop unit if the controller becomes idle while the memory card device is in a state in which the memory card device needs not to receive the command concerning an access to the nonvolatile memory device from the host apparatus.

10. A card device capable of being removably inserted in a host apparatus, said card device comprising:
a core logic configured to operate in accordance with a command supplied from the host apparatus;
a clock signal generator including a PLL configured to generate a clock signal to be supplied to the core logic;
a first clock stop unit configure to stop the operation of the PLL, in order to stop supplying the clock signal to the core logic;
a second clock stop unit configure to shut off the clock signal outputted from the PLL, in order to stop supplying the clock signal to the core logic; and
a control unit configure to activate the first clock stop unit or the second clock stop unit when the core logic becomes idle to wait for commands, in accordance with a current state of the card device.

11. The card device according to claim 10, further comprising a clock supply control unit configured to start the operation of the PLL, when a command is supplies from the host apparatus to the card device while the operation of the PLL is stopped, and to supply the clock signal to the core logic, upon lapse of a predetermined time from starting of the operation of the PLL, said predetermined time being time required by the PLL to operate stably.

* * * * *

UNITED STATES PATENT AND TRADEMARK OFFICE
CERTIFICATE OF CORRECTION

PATENT NO.   : 6,407,940 B1
DATED        : June 18, 2002
INVENTOR(S)  : Aizawa

It is certified that error appears in the above-identified patent and that said Letters Patent is hereby corrected as shown below:

Column 9,
Line 42, "transfer State" should read -- transfer state --.
Line 45, "is supplies" should read -- is supplied --.

Column 10,
Lines 6, 9 and 12, "configure" should read -- configured --.
Line 18, "is supplies" should read -- is supplied --.
Lines 41, 44 and 47, "configure" should read -- configured --.
Line 53, "is supplies" should read -- is supplied --.

Signed and Sealed this

Fifteenth Day of April, 2003

JAMES E. ROGAN
*Director of the United States Patent and Trademark Office*